US010771014B2

(12) United States Patent
Ciubotaru

(10) Patent No.: US 10,771,014 B2
(45) Date of Patent: Sep. 8, 2020

(54) OSCILLATOR BIAS STABILIZATION CIRCUIT FOR SINGLE-PIN CRYSTAL OSCILLATORS

(71) Applicant: Arm Limited, Cambridge (GB)

(72) Inventor: Alexandru Aurelian Ciubotaru, Coconut Creek, FL (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/205,606

(22) Filed: Nov. 30, 2018

(65) Prior Publication Data

US 2020/0177129 A1    Jun. 4, 2020

(51) Int. Cl.
*H03B 5/36* (2006.01)
*H03B 5/06* (2006.01)
*H03L 3/00* (2006.01)

(52) U.S. Cl.
CPC .............. *H03B 5/364* (2013.01); *H03B 5/06* (2013.01); *H03B 5/36* (2013.01); *H03L 3/00* (2013.01); *H03B 2200/0026* (2013.01); *H03B 2200/0058* (2013.01); *H03B 2200/0062* (2013.01)

(58) Field of Classification Search
CPC .... H03B 5/06; H03B 5/36; H03B 2200/0062; H03B 2200/0026; H03B 2200/0058; H03L 3/00; H03L 5/00
USPC ..... 331/116 FE, 158, 185, 175, 183, 182, 57
See application file for complete search history.

(56) References Cited

U.S. PATENT DOCUMENTS

| | | |
|---|---|---|
| 7,109,813 B2 | 9/2006 | Pan |
| 2006/0267704 A1* | 11/2006 | Stevenson ................ H03B 5/06 331/185 |
| 2011/0037527 A1 | 2/2011 | Shrivastava et al. |
| 2012/0126907 A1 | 5/2012 | Nakamoto et al. |

OTHER PUBLICATIONS

Van den Homberg, J.A.T.M., "A Universal 0.03-mm# One-Pin Crystal Oscillator in CMOS", IEEE J. Solid-State Circuits, pp. 956-961, Jul. 1999, vol. 34, No. 7.
Maekawa, T. et al., "Design of CMOS inverter-based output buffers adapting the Cherry-Hopper broadbanding technique", 2009 European Conference on Circuit Theory and Design, pp. 511-514.
Fairchild Semiconductor, AN-88, "CMOS Linear Applications," https://www.fairchildsemi.com/application-notes/AN/AN-88.pdf, Fairchild Semiconductor. Application Note. Jul. 1973. Revised Apr. 2003.
Zheng, W. et al., "Analysis and design of quickly starting crystal oscillator", 2015 IEEE 11th Int. Conf. on ASIC (ASICON), Nov. 3-6, 2015.

(Continued)

*Primary Examiner* — Arnold M Kinkead
(74) *Attorney, Agent, or Firm* — Leveque IP Law, P.C.

(57) ABSTRACT

An oscillator bias stabilization circuit and method for biasing the circuit is disclosed. The bias stabilization circuit includes a plurality of resistive dividers responsive to a control signal in the circuit. The plurality of resistive dividers are selectably connectable in the circuit to provide an adaptable equivalent resistance in response to a control signal while keeping a bias voltage produced by the circuit substantially constant as the loop gain of an oscillator is varied. The plurality of resistive dividers are coupled to a node in the oscillator that establishes the bias voltage.

18 Claims, 8 Drawing Sheets

(56) References Cited

OTHER PUBLICATIONS

Vittoz, E., 'Low-Power Crystal and MEMS Oscillators', Springer, 2010, Ch. 6.
Martins, M.A. et al., "A 0.02-to-6GHz SDR Balun-LNA Using a Triple-Stage Inverter-Based Amplifier", 2012 IEEE International Symposium on Circuits and Systems, pp. 472-475.

* cited by examiner

OSCILLATOR BIAS STABILIZATION CIRCUIT FOR SINGLE-PIN CRYSTAL OSCILLATORS

BACKGROUND

The present disclosure relates generally to integrated circuits, and more particularly, an oscillator bias stabilization circuit for single-pin crystal oscillators with fast start-up capability.

Modern clocking circuits in integrated circuits require stable frequency references (i.e., oscillators) with fast turn-on, small output noise, and low power consumption. Because of stringent frequency stability requirements, an external resonator with a high-quality factor (i.e., a quartz crystal) is typically employed in conjunction with active components in the integrated circuit for generating the reference oscillations. However, because the number of pins available in an integrated circuit for interfacing with other external circuits is limited, it is advantageous to use only one pin for connecting the resonator. Consequently, circuit implementations of oscillators that satisfy the foregoing requirements are challenging, especially in low-supply-voltage environments where the active devices (i.e., transistors) must operate with small headroom voltages.

An undesirable characteristic in such circuits can arise due to component mismatches that cause variations in the common-mode voltage (bias) of the circuit. These variations can be large enough during start-up so as to cause transistors in the active core of the oscillator to operate in a non-linear region (i.e., the triode region of MOS transistors), thereby reducing the oscillator loop gain and increasing the start-up time.

Accordingly, there exists a need for an oscillator bias stabilization circuit that prevents undesirable bias variations in the circuit during start-up to ensure sufficient loop gain and fast start-up time.

BRIEF DESCRIPTION OF THE DRAWINGS

The present disclosure is illustrated by way of example and not limited in the accompanying figures in which like reference numerals indicate similar elements and in which.

DETAILED DESCRIPTION

Figure 1:
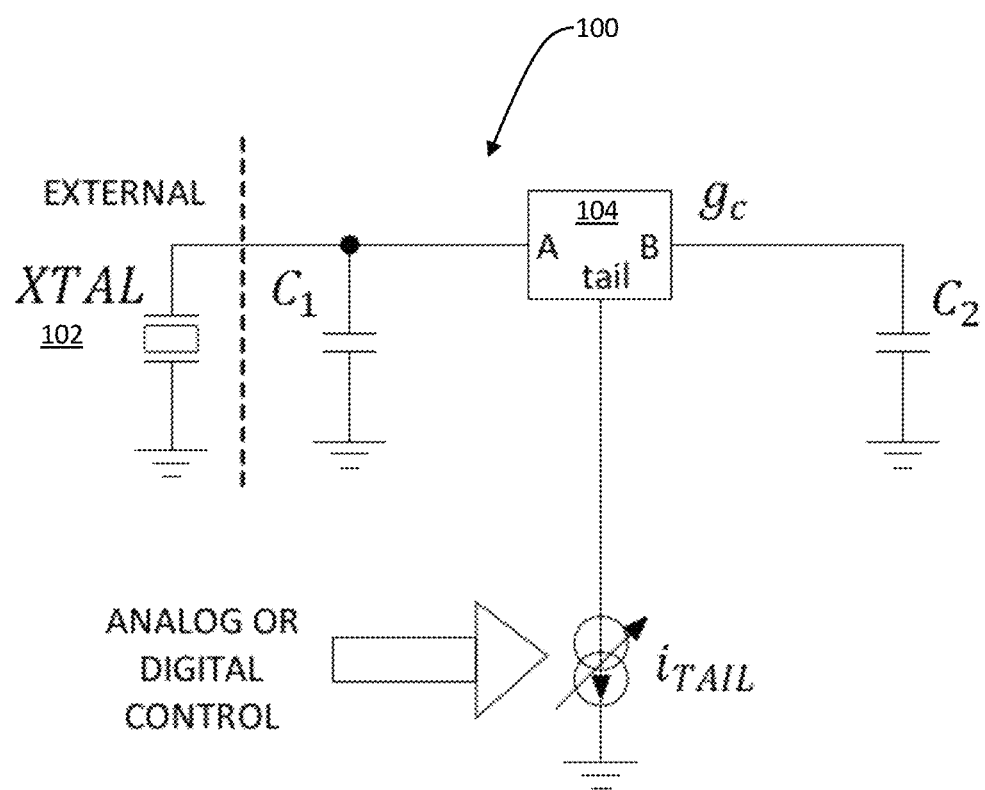
FIG. 1 is a schematic of an exemplary circuit for controlling the loop gain to accelerate the start-up of a one-pin crystal oscillator.

Specific embodiments of the disclosure will now be described in detail regarding the accompanying figures. For simplicity and clarity of illustration, where considered appropriate, reference numerals may be repeated among the figures to indicate corresponding or analogous elements. In addition, numerous specific details are set forth in order to provide a thorough understanding of the examples described herein. However, it will be understood by those of ordinary skill in the art that the examples described herein may be practiced without these specific details. In other instances, well-known methods, procedures and components have not been described in detail so as not to obscure the examples described herein. Also, the description is not to be considered as limiting the scope of the examples described herein.

It will be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

In the following detailed description of embodiments of the disclosure, numerous specific details are set forth in order to provide a more thorough understanding of the disclosure. However, it will be apparent to those skilled in the art that the disclosure may be practiced without these specific details. In other instances, well-known features have not been described in detail to avoid unnecessarily complicating the description.

It is to be understood that the terminology used herein is for the purposes of describing various embodiments in accordance with the present disclosure and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period.

As used herein, the terms "about" or "approximately" apply to all numeric values, irrespective of whether these are explicitly indicated. Such terms generally refer to a range of numbers that one of skill in the art would consider equivalent to the recited values (i.e., having the same function or result). These terms may include numbers that are rounded to the nearest significant figure. In this document, any references to the term "longitudinal" should be understood to mean in a direction corresponding to an elongated direction of a personal computing device from one terminating end to an opposing terminating end.

In accordance with one embodiment of the present disclosure, there is provided an oscillator bias stabilization circuit. The circuit includes a plurality of resistive dividers responsive to a control signal in the circuit, where the plurality of resistive dividers are selectably connectable in the circuit to provide an adaptable equivalent resistance (i.e., the parallel resistance of the voltage-divider resistors) in response to a control signal while keeping a bias voltage produced by the circuit substantially constant as the loop gain of an oscillator is varied. The plurality of resistive dividers are coupled to a node in the oscillator that establishes the bias voltage.

In accordance with another embodiment, the plurality of resistive dividers are connected in parallel with a fixed resistive divider of the circuit.

In accordance with yet another embodiment, the bias voltage is the common-mode voltage of a plurality of active transconductor cells of a transconductor of the circuit.

In accordance with still another embodiment, the adaptable equivalent resistance minimizes DC fluctuations associated with different values of the loop gain during oscillator startup of the oscillator until a specified level of oscillation is reached.

In accordance with a further embodiment, the circuit includes a start module having a plurality of startup transconductance cells, where each startup transconductance cell is coupled to a corresponding logic gate for selectably engaging and disengaging the startup transconductance cell. A core module is coupled to a resonator and the startup module. The core module has a plurality of core transconductance cells, where each core transconductance cell is coupled to a corresponding logic gate for selectably engaging and disengaging the core transconductance cell. A programmable number of the plurality of startup transconductance cells are engageable in an initial phase of oscillation to temporarily increase transconductance loop gain and energize the resonator. The programmable number of start-up transconductance cells are disengaged when a specified level of oscillation is reached.

In accordance with another embodiment, the oscillator bias stabilization circuit further includes a start select decoder that generates a digital start-select code. The start select decoder is coupled to the logic gates for selectably engaging and disengaging each start transconductance cell. A core select decoder that generates a digital core-select code is coupled to the logic gates for selectably engaging and disengaging each core transconductance cell. The digital start-select and core-select coder are operable to selectively engage and disengage switches coupled to each of the resistive dividers.

In accordance with embodiments of the disclosure, the oscillator may be a single-pin crystal oscillator, a van den Homberg oscillator or the like.

In accordance with another embodiment, there is provided a method of stabilizing a bias voltage in an oscillator circuit. The method includes varying the loop gain of an oscillator, and in response to a control signal, selectably connecting a plurality of resistive dividers in the circuit to provide an adaptable equivalent resistance while keeping the bias voltage substantially constant as the loop gain is varied. The plurality of resistive dividers are coupled to a node in the oscillator that establishes the bias voltage.

In accordance with a further embodiment, the method further includes: until the specified level of oscillation for a resonator is reached, selectably engaging at least one of a plurality of startup transconductance cells in a start module; selectably engaging at least one of a plurality of core transconductance cells in a core module coupled to the resonator and the start module; and upon reaching the specified level of oscillation for the resonator, selectably disengaging the at least one of the plurality of startup transconductance cells in the start module.

In accordance with yet another embodiment, the method further includes engaging and disengaging the at least one of the plurality of startup transconductance cells responsive to a signal from a corresponding logic gate coupled to one or more of the startup transconductance cell and the core transconductance cell.

In accordance with still another embodiment, the method further includes: signaling a logic gate coupled to a corresponding startup transconductance cell with a digital start-select code from a start select decoder to selectably engage and disengage the startup transconductance cell; signaling a logic gate coupled to a corresponding core transconductance cell with a digital core-select code from a core select decoder to selectably engage and disengage the core transconductance cell; and selectively engaging and disengaging switches coupled to each of the resistive dividers to connect and disconnect the plurality of resistive dividers to the circuit.

In accordance with yet another embodiment, the method further includes recording a common-mode voltage deviation of the circuit as a function of a gain control code, where the bias voltage varies as the gain control code increases or decreases.

Figure 2:
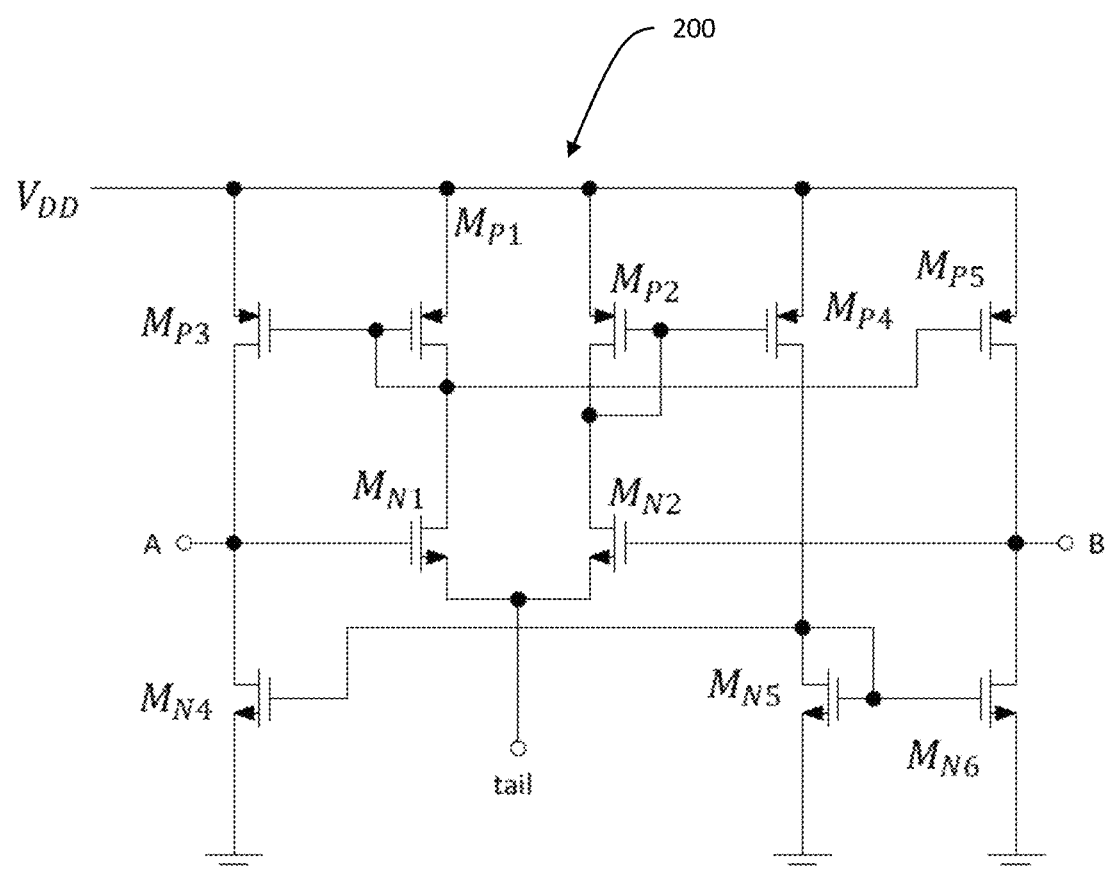
FIG. 2 is a schematic of an illustrative circuit for the transconductance cell shown in FIG. 1.

Referring to FIG. 1, there is depicted an exemplary circuit for controlling the loop gain to accelerate the start-up of a one-pin oscillator 100 having a resonator 102, where $g_c$ is a transconductance cell 104 with output nodes "A" and "B". The oscillator may be, for example, a van den Homberg oscillator. An illustrative circuit 200 for the transconductance cell $g_c$ 104 of FIG. 1 is shown in the schematic diagram of FIG. 2. Circuit 200 comprises a plurality of transistors $M_{P1}, \ldots, M_{P5}$, and $M_{N1}, \ldots, M_{N6}$ arranged as shown. The loop gain is controlled by adjusting the tail current $i_{TAIL}$ applied to $M_{N1}$, $M_{N2}$ using either analog or digital techniques.

Figure 3:
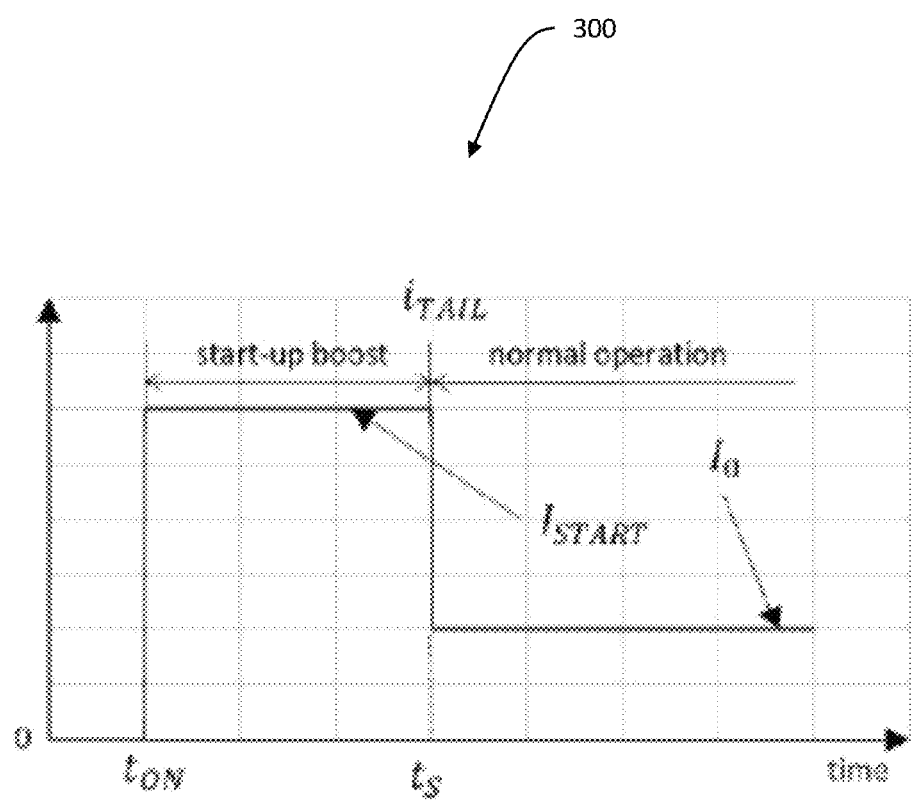
FIG. 3 graphically depicts an exemplary tail current waveform for accelerating the start-up of the oscillator shown in FIG. 1.

FIG. 3 graphically depicts an exemplary tail current $i_{TAIL}$ waveform 300 for accelerating the start-up of oscillator 100 shown in FIG. 1, where oscillator 100 is started at moment $t_{ON}$, and $i_{TAIL}$ has a temporarily large value $I_{START}$ for a period until moment $t_S$. Because the transconductance of $g_c$ 104 is generally larger for greater values of $i_{TAIL}$, the relatively large $I_{START}$ temporarily increases the open-loop gain of the oscillator 100 and accelerates the oscillation build-up in the circuit. After the oscillations reach a sufficiently high level at moment $t_S$, $I_{TAIL}$ assumes a steady-state value $I_0$, which is relatively small but sufficiently large enough to safely maintain the oscillation in the circuit. To achieve overall low power consumption of the oscillator, both $I_{START}$ and $I_0$ and the time difference between $t_{ON}$ and $t_S$ should be minimized. However, in certain communication systems where the oscillator must be fully operational in a very short period of time, it is necessary for $I_{START}$ to be substantially larger than $I_0$.

Figure 4:
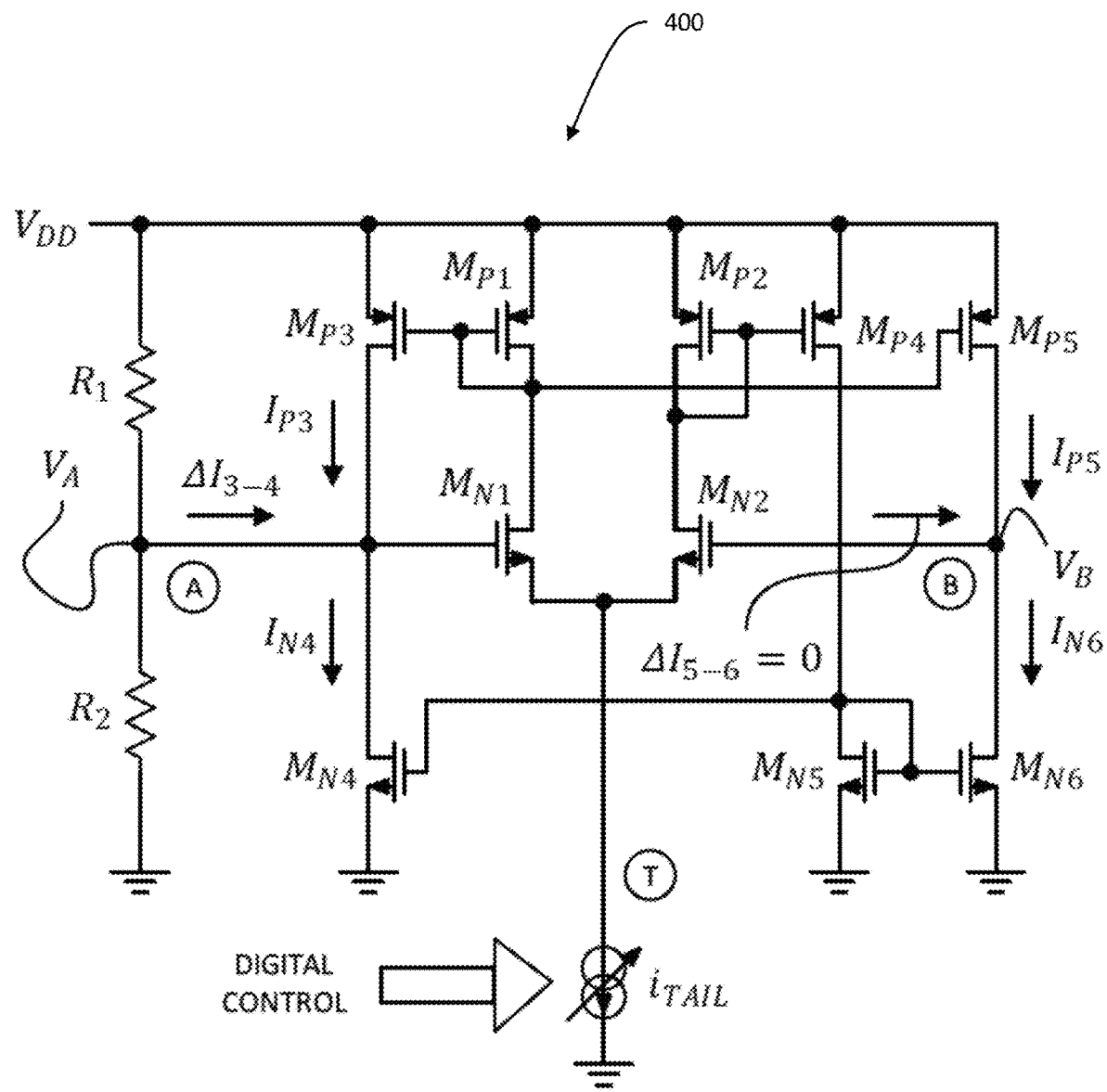
FIG. 4 is a schematic of a transconductor circuit where the programmable tail current is applied to a differential pair of transistors in the circuit and deviations result due to imperfections in the components.

Referring now to FIG. 4, there is depicted a schematic of a transconductor circuit 400 where the programmable tail current $i_{TAIL}$ is applied to a differential pair $M_{N1}$-$M_{N2}$. The application of the tail current may conform to the shape illustrated graphically in FIG. 3, using the architecture depicted in FIG. 5 and described in detail in U.S. patent application Ser. No. 15/695,493 filed on Sep. 5, 2017, assigned to the Assignee of the present application and incorporated by reference herein. However, as can be seen in FIG. 4, there may exist circuit imperfections that can cause undesirable start-up behavior. As a result of amplification and the presence of negative feedback, the transconductor 400 is biased such that nodes A and B are at approximately the same DC potential. At the same time, because the gate current of transistor $M_{N2}$ is practically zero, the DC drain currents of $M_{P5}$ and $M_{N6}$ are equal (i.e., $\Delta I_{5-6}=0$, $I_{P5}=I_{N6}$). Ideally, with identical component scaling in the upper and the lower sections of the circuits, the DC drain currents of $M_{P3}$ and $M_{N4}$ ($I_{P3}$ and $I_{N4}$, respectively) accurately mirror the currents of $M_{P5}$ and $M_{N6}$ (such that $I_{P3}=I_{P5}$, and $I_{N4}=I_{N6}$)—in this way, it follows that $I_{P3}=I_{N4}$ and current $\Delta I_{3-4}=I_{N4}-I_{P3}=0$ introduces no change in voltage $V_A$ relative to its prescribed value. On the other hand, if realistic component mismatches are present, currents $I_{P3}$, $I_{N4}$ will no longer accurately mirror $I_{P5}I_{N6}$, respectively (although $I_{P5}=I_{N6}$ still holds), and as a consequence, $I_{P3}\neq I_{N4}$ and $I_{3-4}\neq 0$, which produces a voltage deviation of $\Delta I_{3-4}\cdot(R_1\|R_2)$ in the prescribed value of $V_A$. If this deviation is too large (i.e., exacerbated at large values of the tail current $i_{TAIL}$), then the drain-source voltages of $M_{P3}$ or $M_{N4}$ (and thus $M_{P5}$ or $M_{N6}$ due to the feedback of the sub-circuit around pair $M_{N1}-M_{N2}$), may drop below minimum values necessary for oscillation within the linear region (i.e., outside the triode region), thereby causing the oscillator loop gain to drop and improper start-up. Additionally, the current source ($I_{TAIL}$) may be pushed out of its compliance range at large negative $V_A$ deviations. This has an immediate effect of reducing the output current of $i_{TAIL}$ and consequently the oscillator loop-gain. Thus, where a fixed resistive divider $R_1$-$R_2$ is used for biasing the oscillator, increasing the current $i_{TAIL}$ in the presence of such component mismatches can have the detrimental effect of actually reducing as opposed to increasing the oscillator loop gain.

Figure 5:
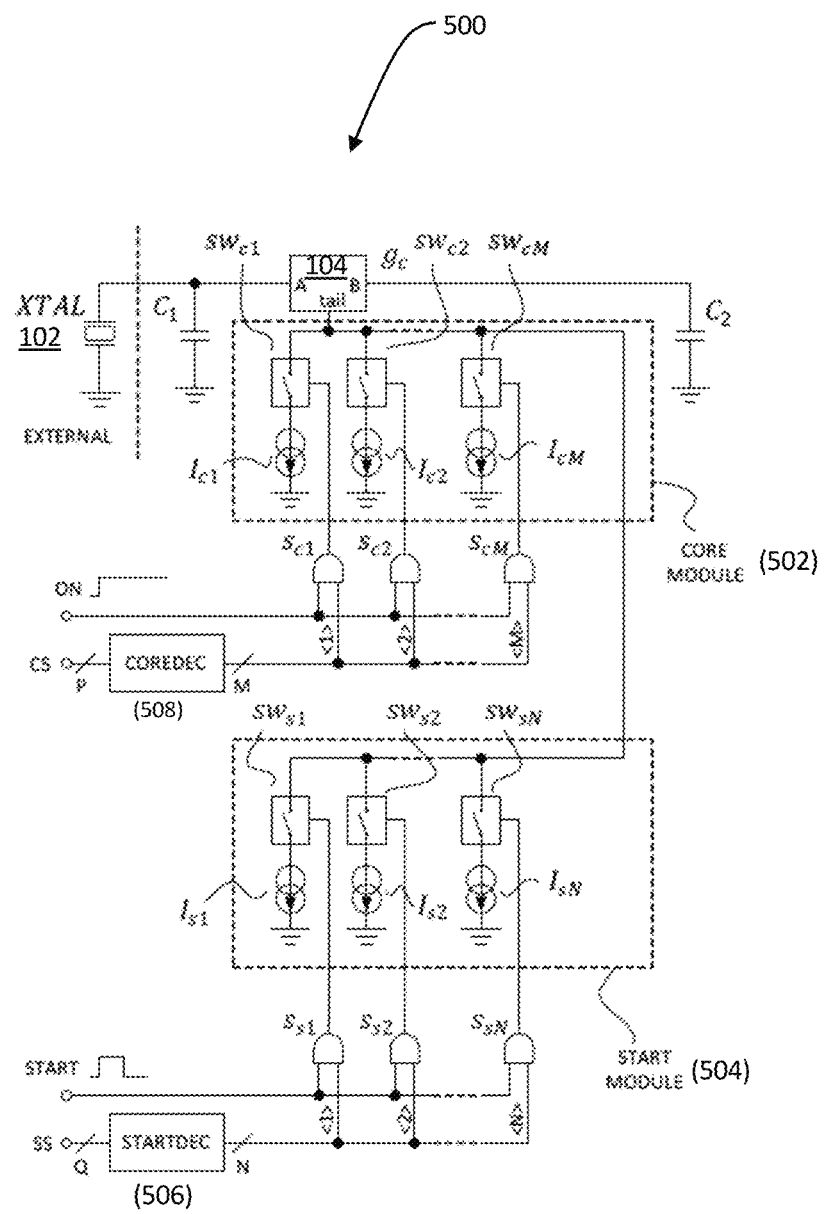
FIG. 5 is a schematic circuit diagram in accordance with an embodiment of the disclosure for digitally controlling the tail current of the oscillator circuit of FIGS. 1, 2 and 4.

Referring now to FIG. 5, there is depicted a schematic circuit diagram 500 in accordance with an embodiment of the disclosure for digitally controlling the tail current $i_{TAIL}$ of the oscillator circuit of FIGS. 1-4. In the sample embodiment, the currents of sources $I_{c1}, \ldots, I_{cM}$ and $I_{s1}, \ldots, I_{sN}$ may be selectively added via switches $sw_{c1}, \ldots, sw_{cM}$, and $sw_{s1}, \ldots, sw_{sN}$, respectively. Currents $I_{c1}, \ldots, I_{cM}$ and switches $sw_{c1}, \ldots, sw_{cM}$ may be grouped into a core module 502 coupled to transconductance cell $g_c$ 104 to provide a programmable steady-state value $I_0$. Similarly, currents $I_{s1}, \ldots, I_{sN}$ and switches $sw_{s1}, \ldots sw_{sN}$ may be grouped into a start module 504 that, along with the core module 502, provides a programmable start value $I_{START}$. The steady-state current $I_0$ is programmed by a P-bit core select code CS applied to a core-select decoder COREDEC 506, which in turn provides desired logic levels to its M output lines coupled to respective logic AND gates $S_{c1}, \ldots, S_{cM}$. Similarly, current provided by the start module is programmed by a Q-bit core select code SS applied to a start-select decoder STARTDEC 508, which in turn provides desired logic levels to its N output lines coupled to respective logic AND gates $S_{s1}, \ldots, S_{sN}$.

Figure 6:
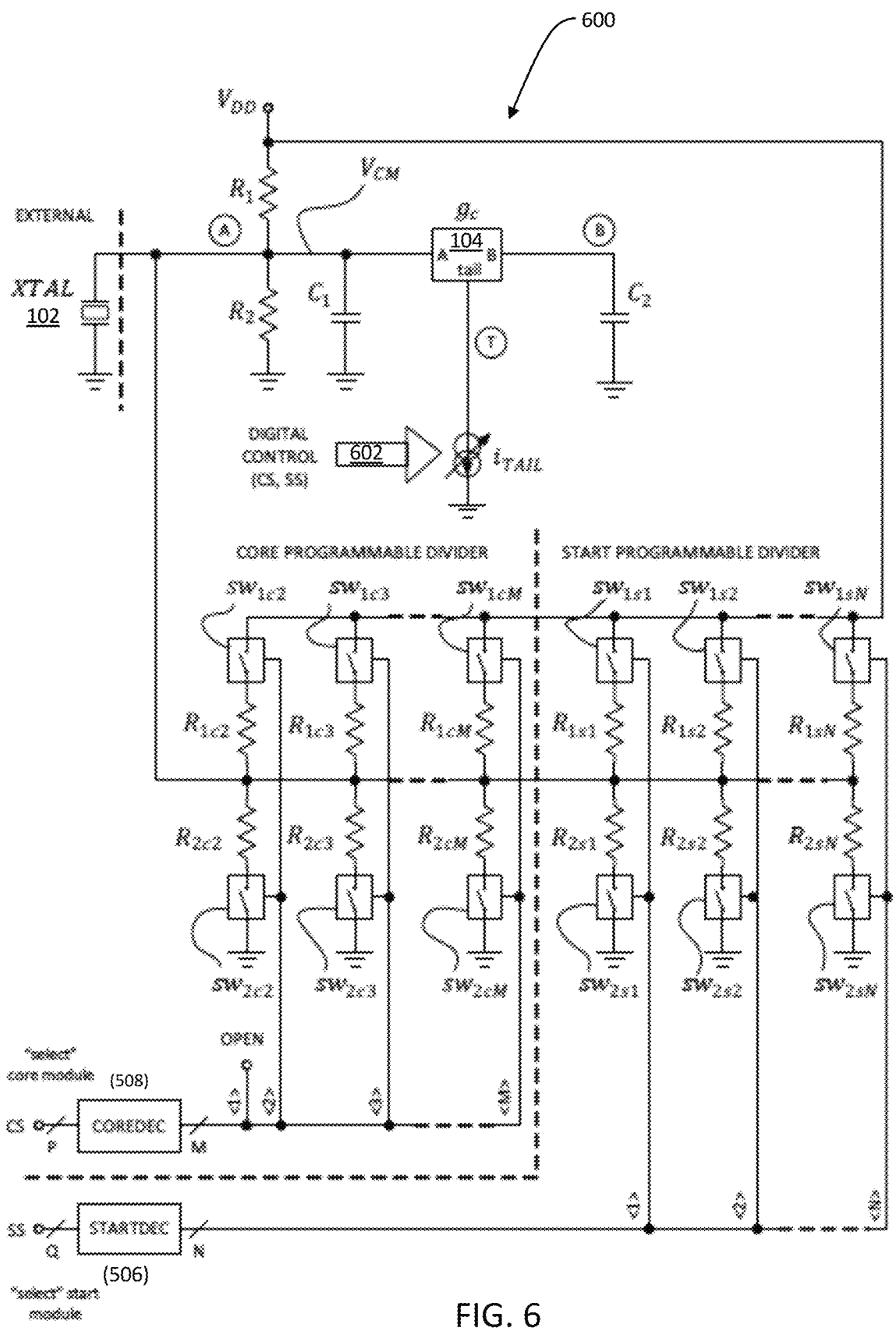
FIG. 6 is an oscillator bias stabilization circuit in accordance with one embodiment of the disclosure.

Referring now to FIG. 6, there is depicted an oscillator bias stabilization circuit 600 in accordance with one embodiment of the disclosure. The circuit 600 includes a first plurality of resistive dividers $R_{1c2}$-$R_{2c2}$, $R_{1c3}$-$R_{2c3}$, ... $R_{1cM}$-$R_{2cM}$ that are selectably connectable to the circuit via corresponding switches $sw_{c1}, \ldots, sw_{cM}$, and a second plurality of resistive dividers $R_{1s1}$-$R_{2s1}$, $R_{1s2}$-$R_{2s2}$, ... $R_{1sN}$-$R_{2sN}$ that are selectably connectable to the circuit 600 via corresponding switches $sw_{s1}, \ldots, sw_{sN}$. The switches are responsive to a digital control signal 602 in the circuit from the COREDEC (CS) and STARTDEC (SS) decoders 506, 508, respectively, as depicted in FIG. 5 and described in the foregoing. The plurality of resistive dividers provide an "adaptable equivalent resistance" in response to the control signal 602 while keeping a bias voltage produced by the circuit 600 substantially constant as the loop gain of the oscillator is varied. The term "adaptable "equivalent resistance" may be defined as the parallel resistance of the voltage-divider resistors.

The plurality of resistive dividers are coupled to node A in the oscillator, which establishes the bias voltage. The resistive dividers $R_{1c2}$-$R_{2c2}$, $R_{1c3}$-$R_{2c3}$, ... $R_{1cM}$-$R_{2cM}$ and $R_{1s1}$-$R_{2s1}$, $R_{1s2}$-$R_{2s2}$, ... $R_{1sN}$-$R_{2sN}$, are connected in paralleled with a fixed resistive divider $R_1$-$R_2$. The <1> output bit of the COREDEC 506 is connected only to logic AND gate $s_{c1}$ and does not control any devices in the core programmable divider depicted in FIG. 6. The resistive dividers $R_{1s1}$-$R_{2s1}$, $R_{1s2}$-$R_{2s2}$, ... $R_{1sN}$-$R_{2sN}$ are controlled by the same outputs of the STARTDEC 508 for controlling the programmable start value $I_{START}$ as described in the foregoing.

When the minimum value of $i_{TAIL}$ ($i_{TAILmin}=I_0$) is selected by the logic control signals CS and SS, all the output bits of COREDEC 506 and STARTDEC 508 are at logic zero with the exception of the <1> output bit of COREDEC 506. Switches $sw_{c1}, \ldots, sw_{cM}$, and $sw_{s1}, \ldots, sw_{sN}$ are opened and as a result, the resistive dividers $R_{1c2}$-$R_{2c2}$, $R_{1c3}$-$R_{2c3}$, ... $R_{1cM}$-$R_{2cM}$ and $R_{1s1}$-$R_{2s1}$, $R_{1s2}$-$R_{2s2}$, ... $R_{1sN}$-$R_{2sN}$ are disconnected from node A. In this state, only the fixed resistive divider $R_1$-$R_2$ is connected in the circuit 600, and the voltage at node A establishes the bias (common-mode) voltage for the rest of the circuit 600. Thus, any statistical deviations in the internal currents of the transconductor $g_c$ can be ameliorated by the relatively large values of $R_1$ and $R_2$ (e.g., $R_1$=25 k$\Omega$, $R_2$=50 k$\Omega$). If a larger $i_{TAIL}$ value is selected via decoders COREDEC 506 and STARTDEC 508, then the corresponding additional resistive dividers $R_{1c2}$-$R_{2c2}$, $R_{1c3}$-$R_{2c3}$, ... $R_{1cM}$-$R_{2cM}$ and $R_{1s1}$-$R_{2s1}$, $R_{1s2}$-$R_{2s2}$, ... $R_{1sN}$-$R_{2sN}$ are connected to node A according to the decoding scheme. For example, in addition to the <1> output bit, assume that only <2> output bit of COREDEC 506 is at logic one, and all the remaining outputs of COREDEC 506 and STARTDEC 508 are at logic zero. Corresponding to this state, $i_{TAIL}$ assumes a larger value than minimum, such as $2I_0$. As a result, the statistical deviations of the internal currents of the transconductor $g_c$ (current $\Delta I_{3-4}$ in FIG. 4) become larger because the tail current $i_{TAIL}$ of the transconductance cell is larger. At the same time, however, the equivalent resistance at node A is smaller because the additional divider $R_{1c2}$-$R_{2c2}$ will appear in parallel with the fixed resistive divider $R_1$-$R_2$. Thus, by appropriately choosing $R_{1c2}$,$R_{2c2}$ relative to $R_1$, $R_2$, it is possible to limit the statistical deviations of the voltage at node A caused by a larger $i_{TAIL}$ (e.g., $R_{1c2}$-150 k$\Omega$, $R_{1c2}$=300 k$\Omega$). The same concept applies to even higher values of $i_{TAIL}$ as selected by COREDEC 506 and STARTDEC 508 where additional resistive dividers $R_{1c2}$-$R_{2c3}$, ... $R_{1cM}$-$R_{2cM}$ or $R_{1s1}$-$R_{2s1}$, $R_{1s2}$-$R_{2s2}$, ... $R_{1sN}$-$R_{2sN}$ are connected to the circuit according to the selected value of $i_{TAIL}$. In this regard, the larger the value of $i_{TAIL}$, the greater the number of resistive dividers are connected to the circuit to change the equivalent resistance. These additional resistive dividers may be identical such as, for example, $R_{1c2}=R_{1c3}=\ldots R_{1cM}=R_{1s2}=R_{1s2}=\ldots R_{1sN}$; and $R_{2c2}=R_{2c3}=\ldots R_{2cM}=R_{2s2}=R_{2s2}=\ldots R_{2sN}$, or the upper and lower sections of the respective dividers may include resistors having unequal resistance.

Figure 7:
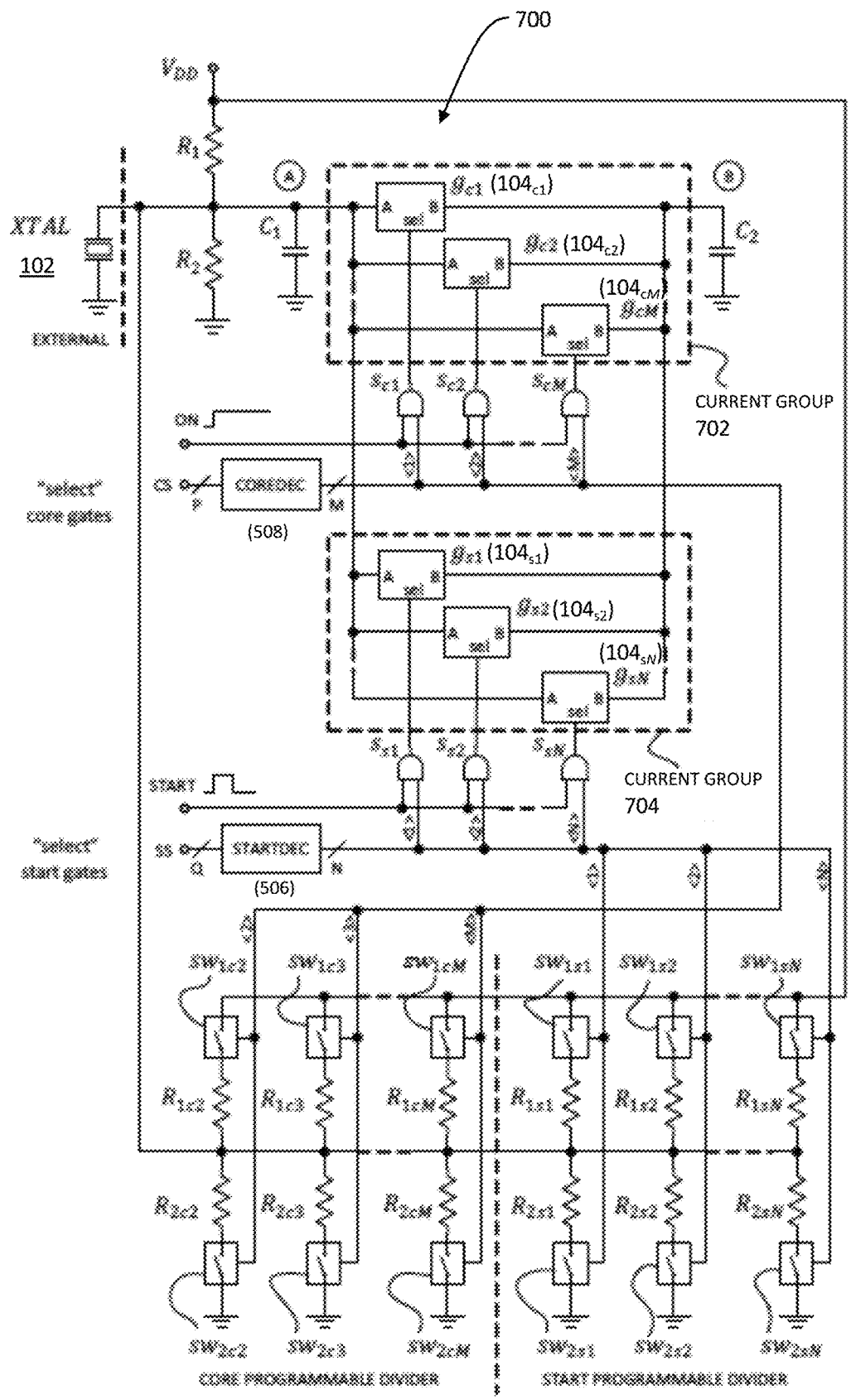
FIG. 7 is an oscillator bias stabilization circuit in accordance with another embodiment of the disclosure.

Referring now to FIG. 7, there is illustrated an oscillator bias stabilization circuit 700 in accordance with another embodiment of the disclosure. In this expedient, a plurality of core transconductance cells $g_{c1}, \ldots, g_{cM}$ ($104_{c1}, \ldots, 104_{cM}$) are grouped into a first current group 702, and a plurality of start-up transconductance cells $g_{s1}, \ldots, g_{sN}$ ($104_{s1}, \ldots, 104_{sN}$) are grouped into a second current group 704. The start-up transconductance cells $g_{s1}, \ldots, g_{sN}$ ($104_{s1}, \ldots, 104_{sN}$) may be identical to the core transconductance cells $g_{c1}, \ldots, g_{cM}$ ($104_{c1}, \ldots, 104_{cM}$), or they may be scaled versions of core transconductance cells $g_{c1}, \ldots, g_{cM}$ ($104_{c1}, \ldots, 104_{cM}$). Each of the transconductance cells $g_{c1}, \ldots, g_{cM}$ ($104_{c1}, \ldots, 104_{cM}$) and $g_{s1}, \ldots, g_{sN}$ ($104_{s1}, \ldots, 104_{sN}$) are connected in parallel and may be selectively added (i.e., engaged) or deselected (i.e., disengaged) responsive to signals output from logic AND gates $S_{c1}, \ldots, S_{cM}$, and $S_{s1}, \ldots, S_{sN}$, respectively. Further, the circuit 700 is provided with a core select decoder COREDEC 506 coupled via M output lines to logic AND gates $S_{c1}, \ldots, S_{cM}$, and a start select decoder STARTDEC 508 coupled via M output lines to logic AND gates $S_{s1}, \ldots, S_{sN}$. Each decoder is configured to function with a corresponding number of bits or the plurality of transconductance cells $g_{c1}, \ldots, g_{cM}$ ($104_{c1}, \ldots, 104_{cM}$) and $g_{s1}, \ldots, g_{sN}$ ($104_{s1}, 104_{sN}$) can be selected in response to the digital core-select code CS from core select decoder COREDEC 506, and the digital start-select code SS from the start select decoder STARTDEC 508, respectively. In this manner, the outputs of decoders COREDEC 506 and STARTDEC 508 may individually select or deselect each of the transconductance cells $g_{c1}, \ldots, g_{cM}$ ($104_{c1}, \ldots, 104_{cM}$) and $g_{s1}, \ldots, g_{sN}$ ($104_{s1}, 104_{sN}$) in current groups 702, 704, respectively, via enable signals ON and START, respectively. During the start-up phase of the oscillation, to provide the necessary oscillator loop-gain for a rapid turn-on some of the cells in the core module $g_{c1}, \ldots, g_{cM}$ ($104_{c1}, \ldots, 104_{cM}$) may advantageously be selected concurrently with some of the cells in the start-up module $g_{s1}, \ldots, g_{sN}$ ($104_{s1}, \ldots, 104_{sN}$) when both the ON and START control signals are at a HIGH logic level. After a predetermined time, or when the oscillation is assessed to have a sufficiently large or defined level of oscillation, for example, when the level of oscillation is sufficient to ensure the desired duty cycle (i.e., 50%), the cells in the start module can be disengaged by taking the START control signal to a LOW logic level. The transconductance cells $g_{c1}, \ldots, g_{cM}$ ($104_{c1}, \ldots, 104_{cM}$) and $g_{s1}, \ldots, g_{sN}$ ($104_{s1}, 104_{sN}$) are engaged or disengaged via a selection control signal "sel" received at the cell from a corresponding logic AND gate $S_{c1}, \ldots, S_{cM}$, and $S_{s1}, \ldots, S_{sN}$, respectively. As in the embodiment depicted in FIG. 6 and described above, the same arrangement and methodology may be employed for bias stabilization. In this regard, a similar sub-circuit composed of additional resistive dividers $R_{1c2}$-$R_{2c2}$, $R_{1c3}$-$R_{2c3}$, . . . $R_{1cM}$-$R_{2cM}$ and $R_{1s1}$-$R_{2s1}$, $R_{1s2}$-$R_{2s2}$, . . . $R_{1sN}$-$R_{2sN}$ and corresponding switches $sw_{c1}, \ldots, sw_{cM}$, and $sw_{s1}, \ldots, sw_{sN}$, respectively, are arranged in the circuit as shown and operate in the manner described in detail above.

The following tables illustrate the effectiveness of the embodiments and methods disclosed herein. In Tables I and II below, statistics were obtained of the bias (common-mode voltage) of a 32-MHz crystal oscillator of the type depicted in FIG. 7 (node A), with a fixed and programmable resistive divider, respectively, for different numbers of identical transconductance cells. A total of 8 cells were employed, using M=3, N=5, and M+N=8, in a 55-nm complementary metal-oxide semiconductor (CMOS), with $V_{DD}$=0.9 V and a nominal $V_A$ established at approximately 0.6 V ($R_1$=25 kΩ, $R_2$=50 kΩ, $R_{1c2}$=$R_{1c3}$=$R_{1s1}$=$R_{1s2}$= . . . $R_{1s5}$=150 kΩ, $R_{2c2}$=$R_{2c3}$=$R_{2s1}$=$R_{2s2}$= . . . $R_{2s5}$=300 kΩ). In the classic configuration, it was observed that a large statistical deviation of the common-mode voltage, which has the potential to push the active devices in the core outside of their linear operating region. The embodiments disclosed herein significantly reduce this deviation to ensure proper operating conditions throughout the oscillator start-up.

TABLE 1

Statistical values of oscillator common-mode voltage and nominal loop gain, using a fixed resistive divider (classic configuration)

| number of cells | min (V) | max (V) | mean (V) | std deviation (mV) | loop gain |
|---|---|---|---|---|---|
| 1 | 0.532 | 0.657 | 0.597 | 23.24 | 5.119 |
| 2 | 0.516 | 0.682 | 0.597 | 31.48 | 9.75 |
| 3 | 0.516 | 0.706 | 0.596 | 37.58 | 13.97 |
| 4 | 0.488 | 0.693 | 0.596 | 43.05 | 17.81 |
| 5 | 0.451 | 0.695 | 0.596 | 46.51 | 21.32 |
| 6 | 0.440 | 0.716 | 0.596 | 53.87 | 24.52 |
| 7 | 0.453 | 0.726 | 0.596 | 53.93 | 27.45 |
| 8 | 0.470 | 0.725 | 0.595 | 58.04 | 30.12 |

TABLE 2

Statistical values of oscillator common-mode voltage and nominal loop gain, using a programmable resistive divider (proposed concept)

| number of cells | min (V) | max (V) | mean (V) | std deviation (mV) | loop gain |
|---|---|---|---|---|---|
| 1 | 0.541 | 0.658 | 0.596 | 23.86 | 4.67 |
| 2 | 0.531 | 0.667 | 0.596 | 29.67 | 8.69 |
| 3 | 0.534 | 0.684 | 0.596 | 32.68 | 12.17 |
| 4 | 0.541 | 0.690 | 0.596 | 32.07 | 15.22 |
| 5 | 0.529 | 0.679 | 0.596 | 32.22 | 17.91 |
| 6 | 0.526 | 0.715 | 0.596 | 32.83 | 20.29 |
| 7 | 0.532 | 0.716 | 0.595 | 31.85 | 22.41 |
| 8 | 0.529 | 0.690 | 0.595 | 31.71 | 24.3 |

Figure 8:
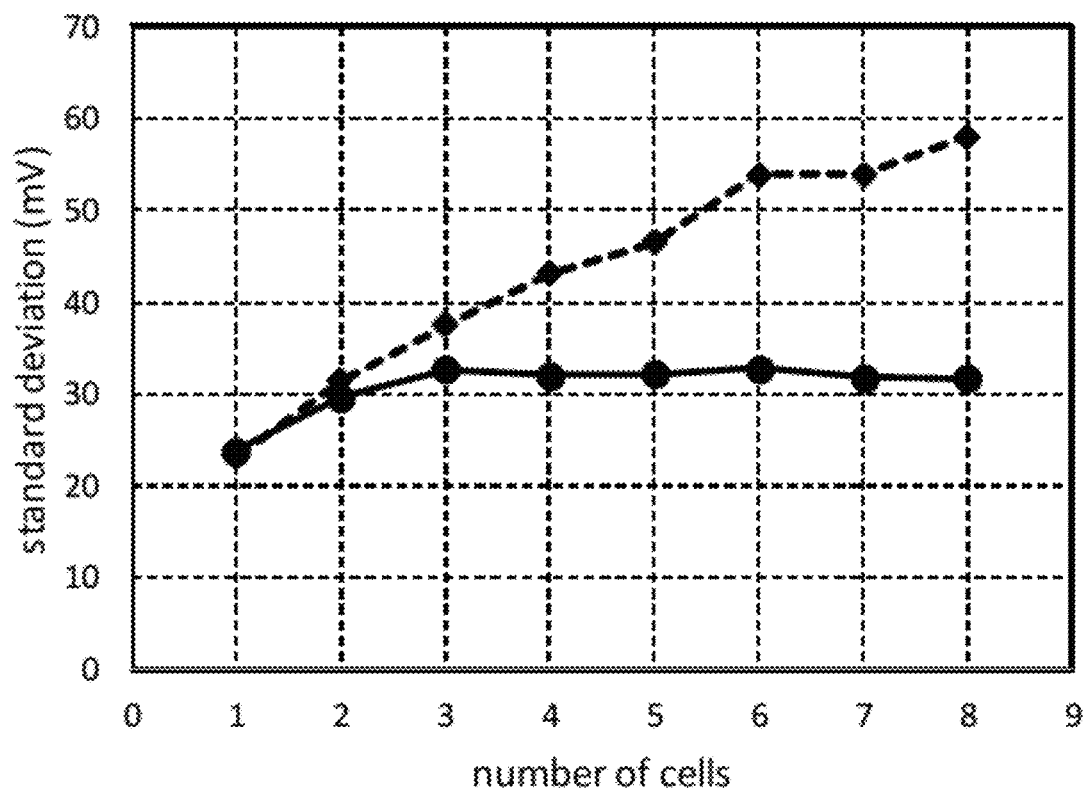
FIG. 8 is a graphical representation that comparatively illustrates the statistical standard deviations using classical expedients and embodiments in accordance with the disclosure for oscillator bias stabilization.

FIG. 8 is a graphical representation that comparatively illustrates the statistical standard deviations of Tables I and II above, with the dashed-line representing the classical approach, and the solid line representing performance in accordance with embodiments of the present disclosure. The reduction in the common-mode deviation comes at the expense of a modest reduction in the loop-gain (e.g., less than 2 dB across all settings). This reduction has been demonstrated to have little significant impact on circuit performance.

The terms "program," "software application," and the like, as used herein, are defined as a sequence of instructions designed for execution on a computer system. A "program," "computer program," or "software application" may include a subroutine, a function, a procedure, an object method, an object implementation, an executable application, an applet, a servlet, a source code, an object code, a shared library/dynamic load library and/or other sequence of instructions designed for execution on a computer system.

The present disclosure may be embodied within a system, a method, a computer program product or any combination thereof. The computer program product may include a computer readable storage medium or media having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

Reference in the specification to "one embodiment" or "an embodiment" means that a particular feature, structure, or characteristic described in connection with the embodiment is included in at least one embodiment of the system. The appearances of the phrase "in one embodiment" in various places in the specification are not necessarily all referring to the same embodiment.

Embodiments of the present disclosure are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Some portions of the detailed descriptions, like the processes may be presented in terms of algorithms and symbolic representations of operations on data bits within a computer memory. An algorithm may be generally conceived to be steps leading to a desired result. The steps are those requiring physical transformations or manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The operations described herein can be performed by an apparatus. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk, read-only memories (ROMs), random access memories (RAMs), EPROMs, EEPROMs, magnetic or optical cards, or any type of media suitable for storing electronic instructions. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on one computer, partly on the computer, as a stand-alone software package, partly on the first computer and partly on a remote computer or entirely on the remote computer or server. In the latter scenario, the remote computer may be connected to the first computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry to perform embodiments of the present disclosure.

Accordingly, embodiments and features of the present disclosure are set out in the following numbered items:

1. An oscillator bias stabilization circuit, including: a plurality of resistive dividers responsive to a control signal in the circuit; a plurality of resistive dividers selectably connectable in the circuit to provide an adaptable equivalent resistance in response to a control signal while keeping a bias voltage produced by the circuit substantially constant as the loop gain of an oscillator is varied, the plurality of resistive dividers coupled to a node in the oscillator that establishes the bias voltage.

2. The oscillator bias stabilization circuit of item 1, where the plurality of resistive dividers are connected in parallel with a fixed resistive divider of the circuit.

3. The oscillator bias stabilization circuit of item 1, where the bias voltage is the common-mode voltage of a plurality of active transconductor cells of a transconductor of the circuit.

4. The oscillator bias stabilization circuit of item 1, where the adaptable equivalent resistance minimizes DC fluctuations associated with different values of the loop gain during oscillator startup of the oscillator until a specified level of oscillation is reached.

5. The oscillator bias stabilization circuit of item 1, further including: a start module having a plurality of startup transconductance cells, each startup transconductance cell coupled to a corresponding logic gate for selectably engaging and disengaging the startup transconductance cell; and a core module coupled to a resonator and the startup module, the core module having a plurality of core transconductance cells, each core transconductance cell coupled to a corresponding logic gate for selectably engaging and disengaging the core transconductance cell, a programmable number of the plurality of startup transconductance cells engageable in an initial phase of oscillation to temporarily increase transconductance loop gain and energize the resonator, the programmable number of startup transconductance cells disengageable when a specified level of oscillation is reached.

6. The oscillator bias stabilization circuit of item 5, further including: a start select decoder that generates a digital start-select code, the start select decoder coupled to the logic gates for selectably engaging and disengaging each start transconductance cell; and a core select decoder that generates a digital core-select code, the core select decoder coupled to the logic gates for selectably engaging and disengaging each core transconductance cell, the digital start-select and core-select coder operable to selectively engage and disengage switches coupled to each of the resistive dividers.

7. The oscillator bias stabilization circuit of item 1, where the oscillator is a single-pin crystal oscillator.

8. The oscillator bias stabilization circuit of item 1, where the oscillator is a van den Homberg oscillator.

9. A method of stabilizing a bias voltage in an oscillator circuit, the method including: varying the loop gain of an oscillator; and in response to a control signal, selectably connecting a plurality of resistive dividers in the circuit to provide an adaptable equivalent resistance while keeping the bias voltage substantially constant as the loop gain is varied, the plurality of resistive dividers coupled to a node in the oscillator that establishes the bias voltage.

10. The method of stabilizing a bias voltage in the oscillator circuit of item 9, where the plurality of resistive dividers are connected in parallel with a fixed resistive divider.

11. The method of stabilizing a bias voltage in the oscillator circuit of item 9, where the bias voltage is the bias of a plurality of active transconductor cells of a transconductor in the circuit.

12. The method of stabilizing a bias voltage in the oscillator circuit of item 9, further including the adaptable equivalent resistance minimizing DC fluctuations associated with different values of the loop gain during oscillator startup until a specified level of oscillation is reached.

13. The method of stabilizing a bias voltage in the oscillator circuit of item 9, further including: until the specified level of oscillation for a resonator is reached, selectably engaging at least one of a plurality of startup transconductance cells in a start module; selectably engaging at least one of a plurality of core transconductance cells in a core module coupled to the resonator and the start module; and upon reaching the specified level of oscillation for the resonator, selectably disengaging the at least one of the plurality of startup transconductance cells in the start module.

14. The method of stabilizing a bias voltage in the oscillator circuit of item 9, further including engaging and disengaging the at least one of the plurality of startup transconductance cells responsive to a signal from a corresponding logic gate coupled to one or more of the startup transconductance cell and the core transconductance cell.

15. The method of stabilizing a bias voltage in the oscillator circuit of item 9, further including: signaling a logic gate coupled to a corresponding startup transconductance cell with a digital start-select code from a start select decoder to selectably engage and disengage the startup transconductance cell; signaling a logic gate coupled to a corresponding core transconductance cell with a digital core-select code from a core select decoder to selectably engage and disengage the core transconductance cell; and selectively engaging and disengaging switches coupled to each of the resistive dividers to connect and disconnect the plurality of resistive dividers to the circuit.

16. The method of stabilizing a bias voltage in the oscillator circuit of item 9, further comprising recording a common-mode voltage deviation of the circuit as a function of a gain control code, the bias voltage varying as the gain control code increases or decreases.

17. The method of stabilizing a bias voltage in the oscillator circuit of item 9, where when a minimum value of a bias current is selected by logic control signals from a start select decoder and a core select decoder, further comprising disconnecting the plurality of resistive dividers from a load node of the transconductor by opening, via the logic control signals, corresponding switches coupled to the plurality of resistive dividers.

18. The method of stabilizing a bias voltage in the oscillator circuit of item 9, where the oscillator is a single-pin crystal oscillator.

19. The method of stabilizing a bias voltage in the oscillator circuit of item 9, where the oscillator is a van den Homberg oscillator.

In accordance with the foregoing, an oscillator bias stabilization circuit and methodology for stabilizing oscillator bias is disclosed. Having thus described the invention of the present application in detail and by reference to embodiments thereof, it will be apparent that modifications and variations are possible without departing from the scope of the invention defined in the appended claims as follows:

I claim:

1. An oscillator bias stabilization circuit, comprising:
   a plurality of resistive dividers responsive to a control signal in the circuit;
   the plurality of resistive dividers selectably connectable in the circuit to provide an adaptable equivalent resistance in response to a control signal while keeping a bias voltage produced by the circuit substantially constant as the loop gain of an oscillator is varied, the plurality of resistive dividers coupled to a node in the oscillator that establishes the bias voltage,
   the plurality of resistive dividers connected in parallel with a fixed resistive divider of the circuit.

2. The oscillator bias stabilization circuit of claim 1, where the bias voltage is the common-mode voltage of a plurality of active transconductor cells of a transconductor of the circuit.

3. The oscillator bias stabilization circuit of claim 1, where the adaptable equivalent resistance minimizes DC fluctuations associated with different values of the loop gain during oscillator startup of the oscillator until a specified level of oscillation is reached.

4. The oscillator bias stabilization circuit of claim 1, further comprising:
   a start module having a plurality of startup transconductance cells, each startup transconductance cell coupled to a corresponding logic gate for selectably engaging and disengaging the startup transconductance cell; and
   a core module coupled to a resonator and the startup module, the core module having a plurality of core transconductance cells, each core transconductance cell coupled to a corresponding logic gate for selectably engaging and disengaging the core transconductance cell,
   a programmable number of the plurality of startup transconductance cells engageable in an initial phase of oscillation to temporarily increase transconductance loop gain and energize the resonator, the programmable number of startup transconductance cells disengageable when a specified level of oscillation is reached.

5. The oscillator bias stabilization circuit of claim 4, further comprising:
a start select decoder that generates a digital start-select code, the start select decoder coupled to the logic gates for selectably engaging and disengaging each startup transconductance cell; and
a core select decoder that generates a digital core-select code, the core select decoder coupled to the logic gates for selectably engaging and disengaging each core transconductance cell,
the digital start-select and core-select coder operable to selectively engage and disengage switches coupled to each of the resistive dividers.

6. The oscillator bias stabilization circuit of claim 1, where the oscillator is a single-pin crystal oscillator.

7. The oscillator bias stabilization circuit of claim 1, where the oscillator is a van den Homberg oscillator.

8. A method of stabilizing a bias voltage in an oscillator circuit, the method comprising:
varying the loop gain of an oscillator; and
in response to a control signal, selectably connecting a plurality of resistive dividers in the circuit to provide an adaptable equivalent resistance while keeping the bias voltage substantially constant as the loop gain is varied, the plurality of resistive dividers coupled to a node in the oscillator that establishes the bias voltage,
the plurality of resistive dividers are connected in parallel with a fixed resistive divider.

9. The method of stabilizing a bias voltage in the oscillator circuit of claim 8, where the bias voltage is the bias of a plurality of active transconductor cells of a transconductor in the circuit.

10. The method of stabilizing a bias voltage in the oscillator circuit of claim 8, further comprising the adaptable equivalent resistance minimizing DC fluctuations associated with different values of the loop gain during oscillator startup until a specified level of oscillation is reached.

11. The method of stabilizing a bias voltage in the oscillator circuit of claim 8, further comprising:
until the specified level of oscillation for a resonator is reached, selectably engaging at least one of a plurality of startup transconductance cells in a start module;
selectably engaging at least one of a plurality of core transconductance cells in a core module coupled to the resonator and the start module; and
upon reaching the specified level of oscillation for the resonator, selectably disengaging the at least one of the plurality of startup transconductance cells in the start module.

12. The method of stabilizing a bias voltage in the oscillator circuit of claim 8, further comprising engaging and disengaging the at least one of the plurality of startup transconductance cells responsive to a signal from a corresponding logic gate coupled to one or more of the startup transconductance cell and the core transconductance cell.

13. The method of stabilizing a bias voltage in the oscillator circuit of claim 8, further comprising:
signaling a logic gate coupled to a corresponding startup transconductance cell with a digital start-select code from a start select decoder to selectably engage and disengage the startup transconductance cell;
signaling a logic gate coupled to a corresponding core transconductance cell with a digital core-select code from a core select decoder to selectably engage and disengage the core transconductance cell; and
selectively engaging and disengaging switches coupled to each of the resistive dividers to connect and disconnect the plurality of resistive dividers to the circuit.

14. The method of stabilizing a bias voltage in the oscillator circuit of claim 8, further comprising recording a common-mode voltage deviation of the circuit as a function of a gain control code, the bias voltage varying as the gain control code increases or decreases.

15. The method of stabilizing a bias voltage in the oscillator circuit of claim 8, where when a minimum value of a bias current is selected by logic control signals from a start select decoder and a core select decoder, further comprising disconnecting the plurality of resistive dividers from a load node of the transconductor by opening, via the logic control signals, corresponding switches coupled to the plurality of resistive dividers.

16. The method of stabilizing a bias voltage in the oscillator circuit of claim 8, where the oscillator is a single-pin crystal oscillator.

17. The method of stabilizing a bias voltage in the oscillator circuit of claim 8, where the oscillator is a van den Homberg oscillator.

18. An oscillator bias stabilization circuit, comprising:
a plurality of resistive dividers responsive to a control signal in the circuit;
the plurality of resistive dividers selectably connectable in the circuit to provide an adaptable equivalent resistance in response to a control signal while keeping a bias voltage produced by the circuit substantially constant as the loop gain of an oscillator is varied, the plurality of resistive dividers coupled to a node in the oscillator that establishes the bias voltage,
the bias voltage is the common-mode voltage of a plurality of active transconductor cells of a transconductor of the circuit.

* * * * *